(12) United States Patent
Jäger et al.

(10) Patent No.: US 10,193,523 B2
(45) Date of Patent: Jan. 29, 2019

(54) FILTER CHIP AND METHOD FOR PRODUCING A FILTER CHIP

(71) Applicant: SNAPTRACK, INC., San Diego, CA (US)

(72) Inventors: Philipp Michael Jäger, München (DE); Werner Ruile, München (DE)

(73) Assignee: SnapTrack, Inc., San Diego, CA (US)

( * ) Notice: Subject to any disclaimer, the term of this patent is extended or adjusted under 35 U.S.C. 154(b) by 27 days.

(21) Appl. No.: 15/314,433

(22) PCT Filed: Aug. 17, 2015

(86) PCT No.: PCT/EP2015/068845
§ 371 (c)(1),
(2) Date: Nov. 28, 2016

(87) PCT Pub. No.: WO2016/030222
PCT Pub. Date: Mar. 3, 2016

(65) Prior Publication Data
US 2017/0201234 A1    Jul. 13, 2017

(30) Foreign Application Priority Data
Aug. 28, 2014    (DE) .......... 10 2014 112 372

(51) Int. Cl.
*H03H 9/02* (2006.01)
*H03H 9/58* (2006.01)
(Continued)

(52) U.S. Cl.
CPC ........ *H03H 9/02015* (2013.01); *H03H 9/205* (2013.01); *H03H 9/582* (2013.01);
(Continued)

(58) Field of Classification Search
CPC .... H03H 9/02015; H03H 9/205; H03H 9/582; H03H 9/605; H03H 9/706;
(Continued)

(56) References Cited

U.S. PATENT DOCUMENTS 7,489,063 B2 *   2/2009   Isobe ............... H03H 3/04
                                                    310/312
9,497,551 B2    11/2016   Ruile et al.
(Continued)

FOREIGN PATENT DOCUMENTS

DE          10207341 A1     9/2002
DE    10 2012 111 889 B3    6/2014
(Continued)

OTHER PUBLICATIONS

"International Search Report and Written Opinion—PCT/EP2015/068845—ISA/EPO—dated Nov. 18, 2015".
(Continued)

*Primary Examiner* — Robert J Pascal
*Assistant Examiner* — Jorge L Salazar, Jr.
(74) *Attorney, Agent, or Firm* — Patterson & Sheridan, L.L.P.

(57) ABSTRACT

The present invention relates to a filter chip (1), comprising an interconnection of at least one first and one second resonator (2, 3) operating with bulk acoustic waves, wherein the first resonator (2) operating with bulk acoustic waves comprises a first piezoelectric layer (4) that is structured in such a way that the first resonator (2) has a lower resonant frequency than the second resonator (3).

22 Claims, 8 Drawing Sheets

(51) Int. Cl.
*H03H 9/205* (2006.01)
*H03H 9/60* (2006.01)
*H03H 9/70* (2006.01)
*H03H 9/05* (2006.01)

(52) U.S. Cl.
CPC ............ *H03H 9/605* (2013.01); *H03H 9/706* (2013.01); *H03H 9/0571* (2013.01); *H03H 9/587* (2013.01); *H03H 9/589* (2013.01); *H03H 2009/0233* (2013.01)

(58) Field of Classification Search
CPC ......... H03H 2009/0233; H03H 9/0571; H03H 9/587; H03H 9/589
USPC .......................... 333/133, 187, 188; 310/312
See application file for complete search history.

(56) References Cited

U.S. PATENT DOCUMENTS

| | | |
|---|---|---|
| 2002/0123177 A1 | 9/2002 | Ruby et al. |
| 2006/0066419 A1* | 3/2006 | Iwaki .................. H03H 7/46 333/133 |
| 2007/0252485 A1 | 11/2007 | Kawakubo et al. |
| 2012/0139665 A1 | 6/2012 | Perez et al. |
| 2013/0033337 A1 | 2/2013 | Nishihara et al. |

FOREIGN PATENT DOCUMENTS

| | | |
|---|---|---|
| EP | 1221770 A1 | 7/2002 |
| EP | 1221770 A1 | 10/2002 |
| JP | 2002335141 A | 11/2002 |
| JP | 2006270770 A | 10/2006 |
| JP | 2007181087 A | 7/2007 |
| JP | 2009027554 A | 2/2009 |
| JP | 2009290591 A | 12/2009 |
| JP | 2013038471 A | 2/2013 |
| WO | WO-2014086524 A2 | 6/2014 |
| WO | WO-2014094887 A1 | 6/2014 |

OTHER PUBLICATIONS

Sun J.H., et al., "A ZnO/Silicon Lamb Wave Filter using Phononic Crystals", Frequency Control Symposium (FCS), 2012 IEEE International, May 21, 2012, XP032205174, pp. 1-4.

International Search Report corresponding to Application No. PCT/EP2015/068845, European Patent Office, dated Oct. 16, 2015; (3 pages).

Sun, J. et al: "A ZnO/silicon Lamb wave filter using phononic crystals", Frequency control symposium (FCS), 2012 IEEE International, IEEE, May 21, 2015, ISBN 978-1-4577-1821-2, pp. 1-4.

\* cited by examiner $2d_1$ $2d_1$

Fig. 8
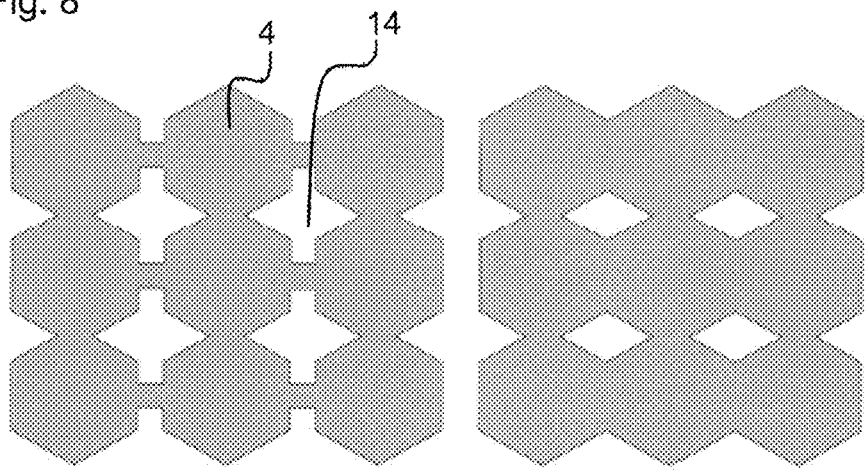
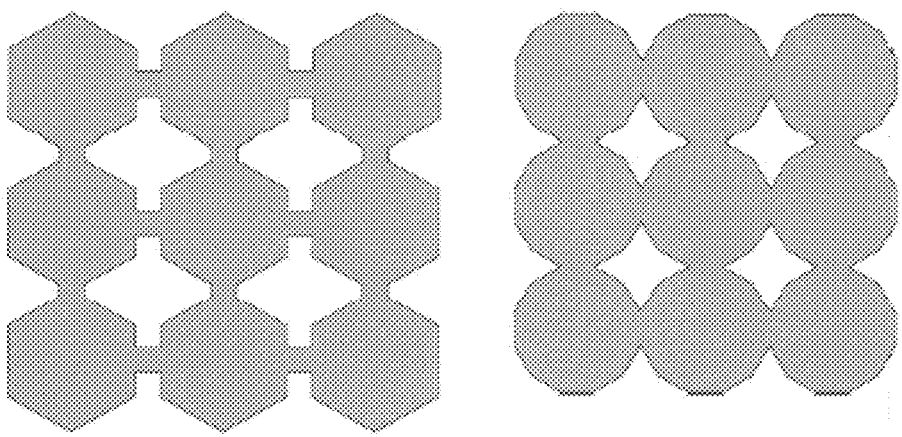
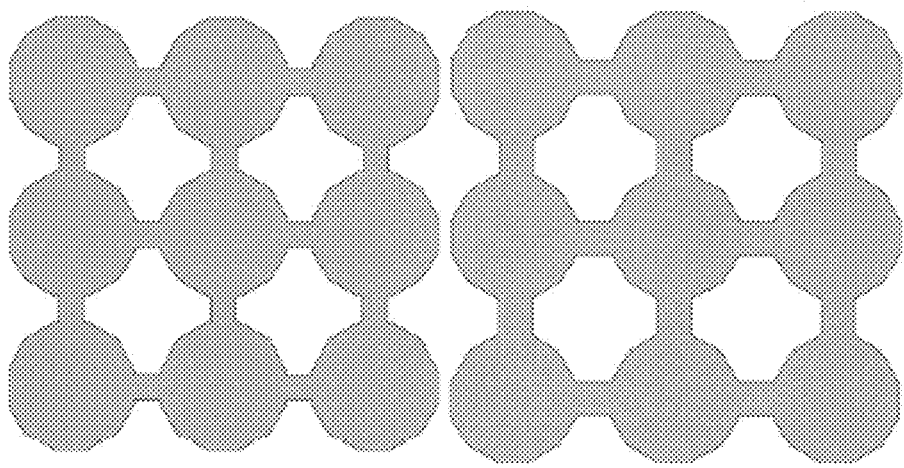

FILTER CHIP AND METHOD FOR PRODUCING A FILTER CHIP

CROSS-REFERENCE TO RELATED APPLICATIONS

This application is a U.S. National Stage of International Application No. PCT/EP2015/068845, filed on Aug. 17, 2015, which claims the benefit of Germany Patent Application No. 10 2014 112 372.7, filed on Aug. 28, 2014, both of which are incorporated herein by reference in their entireties.

The present invention relates to a filter chip comprising a first resonator operating with bulk acoustic waves and a second resonator operating with bulk acoustic waves.

Filter circuits comprising two resonators having a mutually different frequency behavior are required for numerous applications. By way of example, resonators of a duplexer or the resonators of a ladder-type structure may be involved in this context. In order to realize a filter chip comprising resonators having a different frequency behavior, complex methods are necessary. By way of example, the thickness of at least one of the piezoelectric layers of the two resonators could be varied since the resonant frequency of a bulk acoustic wave resonator can be set by means of the thickness of a piezoelectric layer. A trimming layer could also be applied on at least one of the resonators. However, these methods are complex and require a different treatment of the two resonators, which often has to be carried out in separate method steps.

It is therefore an object of the present invention to specify an improved filter chip which enables a simpler production method, for example, and a corresponding production method.

This object is achieved by means of the subject matter of the first independent claim. Furthermore, the object is achieved by means of the method in accordance with the second independent claim. Further configurations and advantageous embodiments are the subject matter of the further claims.

A filter chip is proposed which comprises an interconnection of at least one first and one second resonator operating with bulk acoustic waves, wherein the first resonator operating with bulk acoustic waves comprises a first piezoelectric layer that is structured in such a way that the first resonator has a lower resonant frequency than the second resonator.

The second resonator operating with bulk acoustic waves furthermore has a second piezoelectric layer. The second piezoelectric layer can be unstructured or likewise structured.

The resonators operating with bulk acoustic waves are so-called BAW resonators (BAW=Bulk Acoustic Wave resonator). In the case of the BAW resonator, an electrical signal is converted into an acoustic wave with the aid of the piezoelectric effect, which acoustic wave propagates in the substrate (bulk). Each of the two resonators has a bottom electrode and a top electrode, wherein the respective piezoelectric layer is arranged between the bottom and top electrodes and wherein the bottom electrode is arranged on the side of the respective piezoelectric layer which faces a chip substrate, and the top electrode is arranged on the opposite side of the piezoelectric layer. An AC voltage can then be applied in each case between the bottom and top electrodes, as a result of which an acoustic wave can be excited in the respective piezoelectric layer if the frequency of the AC voltage is in the range of the natural resonance of the respective piezoelectric layer.

The first resonator and the second resonator can be a film bulk acoustic resonator (FBAR) or a solid mounted bulk acoustic resonator (SMR). A film bulk acoustic resonator is arranged in a freely oscillating fashion, wherein a cavity is situated below the resonator. A solid mounted resonator is arranged on an acoustic mirror.

The first and the second piezoelectric layer can in each case comprise aluminum nitride or consist of aluminum nitride. Other piezoelectric materials can also be used for the piezoelectric layers.

The first and possibly also the second piezoelectric layer can be structured. This makes it possible to set the respective resonant frequency of the first and the second resonator in a targeted manner. Structuring here denotes the targeted removal of a part of the respective piezoelectric layer. Prior to structuring, the respective piezoelectric layer can consist of an unstructured block having no openings or cavities. During structuring, material is then removed from said block, for example by forming pits through the block, wherein the piezoelectric material is removed in the pits.

In particular, the first and possibly also the second resonator can be structured in such a way that they have a mutually different resonant frequency. This is achieved by structuring the first and possibly also the second piezoelectric layer, such that the filter chip can be fabricated by a significantly simplified production method. In particular, the first and the second piezoelectric layer can firstly be applied on the chip in an unstructured fashion in a common method step. Afterward, the first piezoelectric layer can be structured photolithographically, such that the resonant frequency of the first resonator is reduced to a greater extent. If appropriate, the second piezoelectric layer can also be structured photolithographically in the same method step, wherein the first piezoelectric layer is structured to a greater extent than the second piezoelectric layer, such that the resonant frequency of the first resonator is reduced to a greater extent. Complex method steps such as, for instance, applying a trimming layer or changing the thickness of one of the piezoelectric layers can accordingly be omitted.

The structuring of the first and possibly also of the second piezoelectric layer furthermore affords the advantage that it is simple to realize and can be carried out with high accuracy. In particular, a resonant frequency can be set more accurately by means of structuring of the piezoelectric layer and by means of variation of the layer thickness.

The first and possibly also the second piezoelectric layer can be structured in such a way that between 5% and 90% of the material of the respective piezoelectric layer is removed during structuring, wherein more material is removed from the first piezoelectric layer than from the second piezoelectric layer. A structuring of the respective piezoelectric layer not only affords the advantage of the targeted setting of the resonant frequency, but also has the effect that the coupling factor of the respective resonator is increased. A high coupling factor makes it possible to realize a large bandwidth of the filter.

The first resonator operating with bulk acoustic waves can have a main mode in a thickness direction, and wherein the second resonator operating with bulk acoustic waves can likewise have a main mode in a thickness direction. In this case, thickness direction can denote the direction from a top electrode arranged on one side of a piezoelectric layer to a bottom electrode arranged on the opposite side of the piezoelectric layer.

The first piezoelectric layer can be structured with pits that run through the first piezoelectric layer. Alternatively or supplementary, the second piezoelectric layer can be structured with pits that run through the second piezoelectric layer. In this case, pit denotes a cutout that extends through the respective piezoelectric layer. The pit can furthermore also extend through the respective top electrode and possibly also through the respective bottom electrode.

The pits can be fabricated in a simple manner in a photolithographic method. The desired degree of the structuring of the respective piezoelectric layer can be set in a targeted manner by the choice of the diameter of the pits and/or by the choice of the number of pits. The greater the extent to which the piezoelectric layer is structured, the greater the extent to which the resonant frequency is reduced.

In this case, the pits can have any desired shape. They can be cylindrical or parallelepipedal, for example. However, differently shaped pits are also conceivable.

In the photolithographic method, firstly a resist layer can be applied on the first and second resonators. The resist layer can then be partly exposed with the aid of a mask and subsequently be developed. An etching process can then be carried out, for example dry etching, plasma etching, ion milling, reactive ion etching or wet-chemical etching. The desired structuring can be achieved in the process. The structuring can produce a pattern in the xy-plane which pattern is also referred to as lateral structuring owing to its formation in the xy-plane. The etching can ensure that said pattern in the form of pits runs in a vertical direction through the respective resonator.

In an alternative embodiment, the pits do not run completely through the first or, if appropriate, the second piezoelectric layer, but rather narrow increasingly, such that they form openings in the respective piezoelectric layer which, however, do not completely penetrate through the latter.

In some embodiments, firstly a hard mask can be produced in a photolithographic method, which hard mask can then be used for the etching. This multi-step procedure may be advantageous particularly in the case of aggressive etching processes.

The pits are preferably not filled. Alternatively, the pits can be filled with a filling layer, wherein the filling layer can exhibit an abnormal thermomechanical behavior, for example. Accordingly, the filling layer could compensate for the thermomechanical behavior of the respective piezoelectric layer. In an alternative configuration, the inner sides of the pits can be covered with a cladding layer. The cladding layer can exhibit an abnormal thermomechanical behavior and/or serve to protect the pits against environmental influences.

The first and/or the second piezoelectric layer can be structured in such a way that pits extend in a vertical direction through the first and/or the second piezoelectric layer. The direction which is parallel to the surface normals of the electrodes is the vertical direction. The lateral direction can furthermore be defined as the direction which is perpendicular to the surface normals of the electrodes.

The first and the second piezoelectric layer can have the same thickness. Since the resonant frequencies of the first and second resonators can be set differently by means of the different structuring of the first and second piezoelectric layers, it is not necessary to configure the thicknesses of the two layers such that they deviate from one another. Rather, the first and second piezoelectric layer can be produced with the same thickness in a common method step and their thickness no longer needs subsequently to be altered. However, the first and the second piezoelectric layer can also differ in their thicknesses. For specific applications it may be advantageous if the first and the second piezoelectric layer have a mutually different thickness, in order to delimit the two resonant frequencies from one another to an even greater extent.

Furthermore, the first and/or the second resonator can have a trimming layer. As described above, in principle, applying a trimming layer in order to realize different resonant frequencies is no longer necessary since the first and the second piezoelectric layer are structured differently with respect to one another. Nevertheless, for specific applications it may be advantageous additionally to provide a trimming layer in order to delimit the two resonant frequencies from one another to an even greater extent. Applying an additional trimming layer on at least one of the two resonators thus increases the design flexibility.

Trimming layer here denotes a layer which is different than the piezoelectric layer. The trimming layer can make it possible to set the resonant frequency of the resonator by means of the choice of its thickness. The trimming layer is usually situated above the piezoelectric layer. The trimming layer can be applied directly on the top electrode of the respective resonator. The trimming layer can be an $SiO_2$ layer. The resonant frequency of the respective resonator can be set by the application process or by the choice of the thickness of the trimming layer. The top electrode itself or parts of the electrode can also act as a trimming layer.

The first piezoelectric layer and/or the second piezoelectric layer can be arranged on an acoustic mirror. In this case, in particular, the bottom electrode of the respective resonator can be formed between the piezoelectric layer and the acoustic mirror. The acoustic mirror ensures that bulk acoustic waves that penetrate into the mirror are reflected and are radiated back into the resonator, such that losses can be minimized. Accordingly, the resonator can be a so-called solid mounted resonator.

Furthermore, the first resonator and/or the second resonator can be arranged in a freely oscillating fashion. In this case, a cavity can be arranged below the bottom electrode of the respective resonator. Accordingly, a film bulk acoustic resonator or a thin film bulk acoustic resonator is involved.

The first piezoelectric layer and/or the second piezoelectric layer can be formed as a phonic bandgap structure. In a phonic bandgap structure, no traveling acoustic waves propagate in two or three spatial directions in a stopband frequency range. Losses owing to emission in a lateral direction can be minimized as a result.

The first and the second resonator can be interconnected with one another in a ladder-type structure having a series resonator and a parallel resonator, wherein the first resonator forms the series resonator or the parallel resonator, and wherein the second resonator forms the respective other selected from series resonator or parallel resonator. Here the first and the second resonator in the case of a bandpass filter are preferably structured in such a way that the pass frequency of the series resonator approximately corresponds to the blocking frequency of the parallel resonator.

A ladder-type filter structure can comprise a signal path having a signal path input and a signal path output. A series resonator is interconnected serially in the signal path. A parallel resonator is interconnected in such a way that one electrode of the parallel resonator is interconnected with the signal path and the other electrode of the parallel resonator is connected to ground via a reactance element.

Filter circuits having ladder-type structures can be constructed from a plurality of serially interconnected basic elements, wherein a basic element substantially consists of a series resonator and a parallel resonator. In this case, the characteristic pass frequency of the series resonator corresponds approximately to the blocking frequency of the parallel resonator. Therefore, such a basic element intrinsically forms a bandpass filter. The right slope of the attenuation characteristic of the passband is crucially determined by the concrete configuration of the series resonator, while the left slope is crucially determined by the configuration of the parallel resonator. The filter chip can be such a basic element.

In particular, the first and the second resonator can be in each case an FBAR resonator. Alternatively, they can be SMR resonators.

The filter chip can also comprise more than two resonators. In particular, the filter chip can comprise even further resonators, which differ from the first and the second resonator in their resonant frequency.

By way of example, the filter chip can be embodied as a duplexer, wherein at least one first and at least one second resonator are interconnected with one another to form a transmission filter, wherein the filter chip furthermore comprises at least one third resonator and at least one fourth resonator, which are interconnected with one another to form a reception filter, wherein the first resonator, the second resonator, the third resonator and the fourth resonator in each case have a mutually different resonant frequency.

In this case, the filter chip can comprise for example a first to a fourth resonator having a first to fourth piezoelectric layer. In this case, by way of example, the first resonator and the second resonator can form the transmission filter and the third resonator and the fourth resonator can form the reception filter. Accordingly, each of the four resonators can be configured in such a way that it has a resonant frequency that deviates from the resonant frequencies of the respective other three resonators. By way of example, the first resonator can be structured to the greatest extent, such that it has the lowest resonant frequency. Furthermore, the second resonator can be structured to a lesser extent than the first resonator, such that it has the second lowest resonant frequency. Furthermore, the third resonator can be structured to a lesser extent than the second resonator, such that it has the third lowest resonant frequency. Furthermore, the fourth resonator can be structured to a lesser extent than the third resonator, such that it has the highest resonant frequency. It is also possible for the fourth resonator to be unstructured. Furthermore, the resonant frequencies of the four resonators can additionally be influenced by means of the respective thickness and/or the application of a trimming layer.

The features described here for a filter chip comprising two resonators can also be realized for a filter chip comprising more than two resonators.

Further examples of acoustic components which could be realized by the filter chip are an L-element, a notch filter, bridge circuits, a T-element, a P-element, a diplexer, a triplexer or a quadruplexer.

In accordance with a further aspect, a method for producing a filter chip is proposed. The method comprises the following steps:

fabricating a first resonator operating with bulk acoustic waves and having a first piezoelectric layer on a chip substrate, fabricating a second resonator operating with bulk acoustic waves and having a second piezoelectric layer on the chip substrate, and photolithographically structuring the first and possibly also the second piezoelectric layer.

In particular, the first and the second piezoelectric layer can firstly be applied on the chip substrate in an unstructured fashion in a common method step. Afterward, the first and possibly also the second piezoelectric layer can be structured photolithographically in a common method step. In this case, it is possible to use a mask which leads to a greater structuring of the first piezoelectric layer, such that the resonant frequency of the first resonator is reduced to a greater extent.

In particular, the filter chip described above can be fabricated in the course of the method. Accordingly, each structural or functional feature which was disclosed in connection with the filter chip can also apply to the method.

The method for producing the filter chip can thus furthermore comprise the following step: photolithographically structuring the second piezoelectric layer. In this case, the second piezoelectric layer can be structured to a lesser extent than the first piezoelectric layer, such that the first resonator has a lower resonant frequency than the second resonator. The structuring of the first and second piezoelectric layers can be performed in a common method step.

The first and the second piezoelectric layer can firstly be applied on the chip substrate in an unstructured fashion in a common method step.

The invention is explained in further detail below with reference to figures.

FIGS. 5a to 5f, 6, 7a, 7b, 8 and 9 show further exemplary embodiments of structured piezoelectric layers, in each case in a plan view of the xy-plane.

Figure 1:
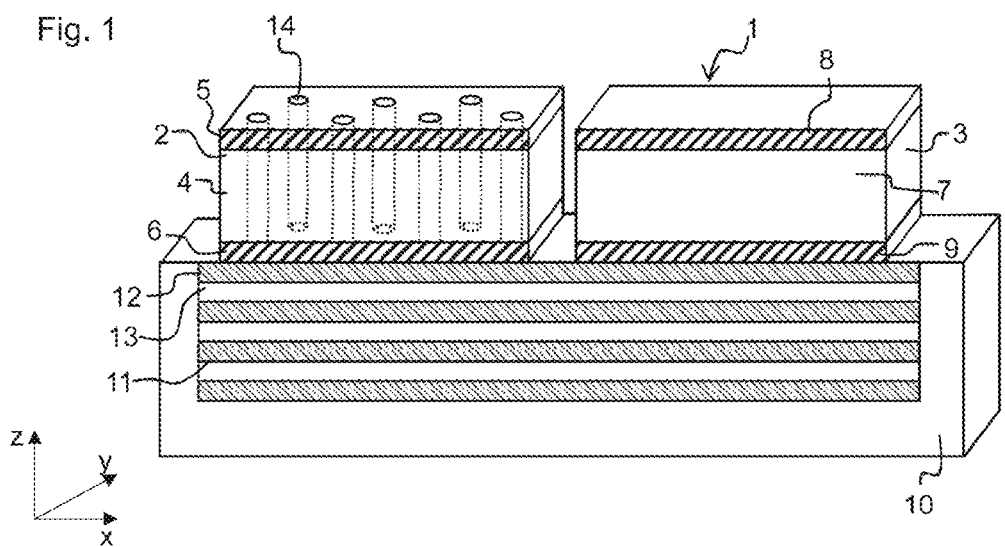
FIG. 1 shows a cross section through a filter chip of a BAW resonator of the SMR type.

FIG. 1 shows a filter chip 1. The filter chip 1 comprises a first resonator 2 operating with bulk acoustic waves and a second resonator 3 operating with bulk acoustic waves.

The first resonator 2 operating with bulk acoustic waves has a first piezoelectric layer 4 that is arranged between a top electrode 5 and a bottom electrode 6. Furthermore, the second resonator 3 operating with bulk acoustic waves also has a second piezoelectric layer 7 that is arranged between a top electrode 8 and a bottom electrode 9. The bottom electrodes 6, 9 are arranged in each case on that side of the respective piezoelectric layer 4, 7 which faces a chip substrate 10. The top electrodes 5, 8 are arranged in each case on that side of the respective piezoelectric layer 4, 7 which faces away from the chip substrate 10.

The first and the second resonator 2, 3 have an identical thickness. In particular, the first piezoelectric layer 4 is exactly as thick as the second piezoelectric layer 7. The first and the second piezoelectric layer 4, 7 can in each case comprise aluminum nitride or consist of aluminum nitride.

The first and the second resonator 2, 3 are arranged on a common chip substrate 10. The chip substrate comprises silicon. An acoustic mirror 11 is formed below the two resonators 2, 3. The acoustic mirror 11 comprises alternately arranged first layers 12 and second layers 13, wherein the second layers 13 differ from the first layers 12 in their acoustic impedance. The acoustic mirror 11 consists, for example, of alternately arranged layers of $SiO_2$ and tungsten.

The first piezoelectric layer 4 is structured. The piezoelectric layers 4 were structured in a photolithographic method. The structuring comprises pits 14 that run through the piezoelectric layers 4. In this case, the pits 14 extend in the vertical direction.

In FIG. 1, the z-direction denotes the direction determined by the surface normal of the electrodes 5, 6, 8, 9. This is designated as the vertical direction. The pits 14 extend in the z-direction. The y-direction is perpendicular to the vertical direction. The x-direction is perpendicular to the y-direction and perpendicular to the z-direction. Both the y-direction and the x-direction are designated as lateral direction. FIG. 1 thus shows the filter chip 1 in a cross section through the x-z plane.

The structuring of the piezoelectric layer 4 has the effect that the resonant frequency of the first resonator 2 is shifted. In particular, the resonant frequency of the first resonator 2 is reduced all the more, the greater the extent to which the first piezoelectric layer 4 is structured. In this case, a greater structuring is tantamount to more material of the first piezoelectric layer 4 having been removed. As a result of the structuring of the first piezoelectric layer 4 of the first resonator 2, the latter has a lower resonant frequency than the second resonator 4.

Figure 2:
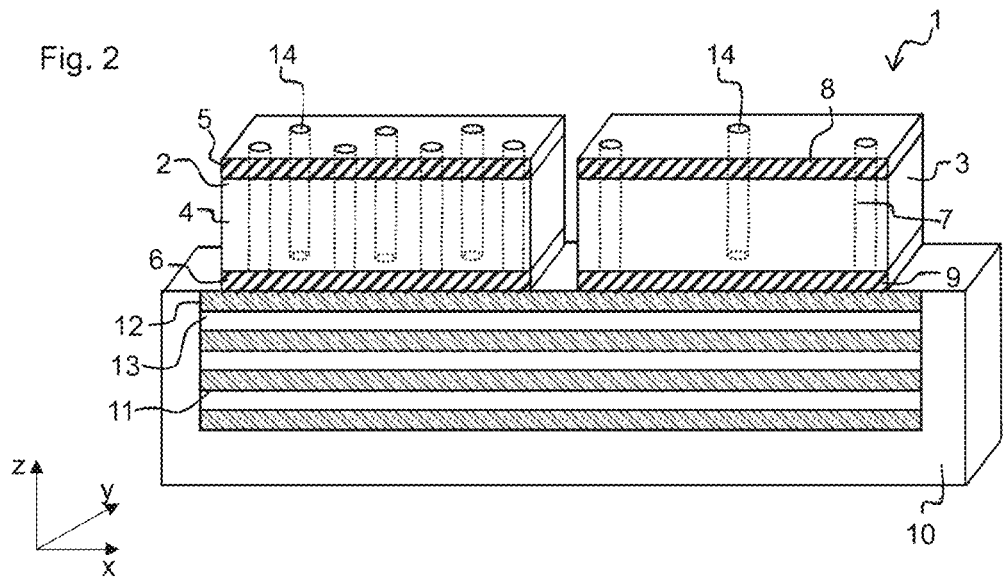
FIG. 2 shows a further cross section through a filter chip of a BAW resonator of the SMR type.

FIG. 2 shows a further filter chip 1, which differs from the filter chip 1 shown in FIG. 1 merely to the effect that, in the case of the filter chip 1 shown in FIG. 2, the second piezoelectric layer 7 is structured as well. The second piezoelectric layer 7 here was structured in a photolithographic method. In particular, the first and the second piezoelectric layer were structured photolithographically in a common method step. The second piezoelectric layer 7 also has pits 14 that extend in a vertical direction through the second piezoelectric layer 7.

The second piezoelectric layer 7 is structured to a lesser extent than the first piezoelectric layer 4, that is to say that, during the structuring, more material was removed from the first piezoelectric layer 4 than from the second piezoelectric layer 7. For this reason, the first resonator 2 has a lower resonant frequency than the second resonator 3.

The pits 14 are not filled both in the exemplary embodiment shown in FIG. 1 and in the exemplary embodiment shown in FIG. 2. In alternative exemplary embodiments, they can be completely filled with a filling layer. Alternatively, just their inner side can be covered with a cladding layer. The filling layer and/or the cladding layer can comprise a material having an anomalous thermomechanical behavior. This material compensates for the normal thermomechanical behavior of the respective piezoelectric layer 4, 7. In particular, the material can stiffen upon heating on account of the abnormal thermomechanical behavior.

Furthermore, the filling layer and/or the cladding layer can protect the respective piezoelectric layer 4, 7 against environmental influences. By way of example, the filling layer and/or the cladding layer can provide for a passivation.

In a first exemplary embodiment, the first resonator 2 and the second resonator 3 can be interconnected with one another to form a ladder-type filter, wherein one of the two resonators 2, 3 forms a parallel resonator and the other resonator forms a series resonator.

Furthermore, two such filter chips 1 can be interconnected to form a duplexer, wherein the respective resonant frequencies of the resonators are adapted by a corresponding structuring. It is also possible to arrange four resonators on a single filter chip. These four resonators here can be structured in each case such that they have resonant frequencies deviating from one another. By way of example, the four resonators can be interconnected to form two ladder-type filters that form the transmission filter and the reception filter of a duplexer.

In a further exemplary embodiment, the first and the second resonator 2, 3 on the filter chip 1 can be interconnected with one another to form a notch structure, wherein one of the resonators 2, 3 forms a parallel resonator and the respective other resonator forms a series resonator.

Figure 3:
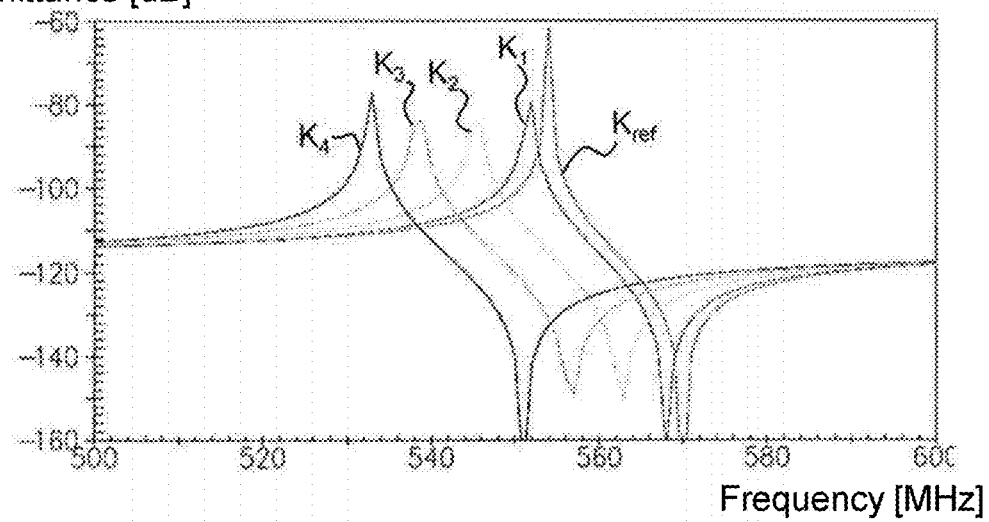
FIG. 3 shows a diagram in which the amplitude of the admittance for various resonators is plotted on a logarithmic scale.

FIG. 3 shows in a diagram the effects of the structuring on the frequency behavior of a resonator 2. In this case, the frequency in MHz is plotted on the abscissa axis. The amplitude of the admittance on a logarithmic scale is plotted on the ordinate axis.

FIG. 3 firstly shows a reference curve $K_{ref}$, which shows the frequency behavior of a resonator having an unstructured piezoelectric layer. Furthermore, the curves $K_1$, $K_2$, $K_3$ and $K_4$ are plotted in FIG. 2, said curves in each case describing the frequency behavior of a resonator having a structured piezoelectric layer, wherein the respective piezoelectric layer here is structured with holes and the diameter of the holes respectively increases from curve $K_1$ to curve $K_4$.

FIG. 3 reveals that the resonant frequency and the anti-resonant frequency of the resonators 2 are shifted downward by structuring of the respective piezoelectric layer 4. In this case, this shift is all the greater, the greater the extent to which the piezoelectric layer 4 is structured, that is to say the more material was removed from the piezoelectric layer 4.

Furthermore, FIG. 3 shows that the pole zero distance of the resonators 2 becomes all the greater, the greater the extent to which the piezoelectric layer 4 is structured. The pole zero distance of a resonator 2 is defined as the distance between resonant frequency and antiresonant frequency.

Figure 4:
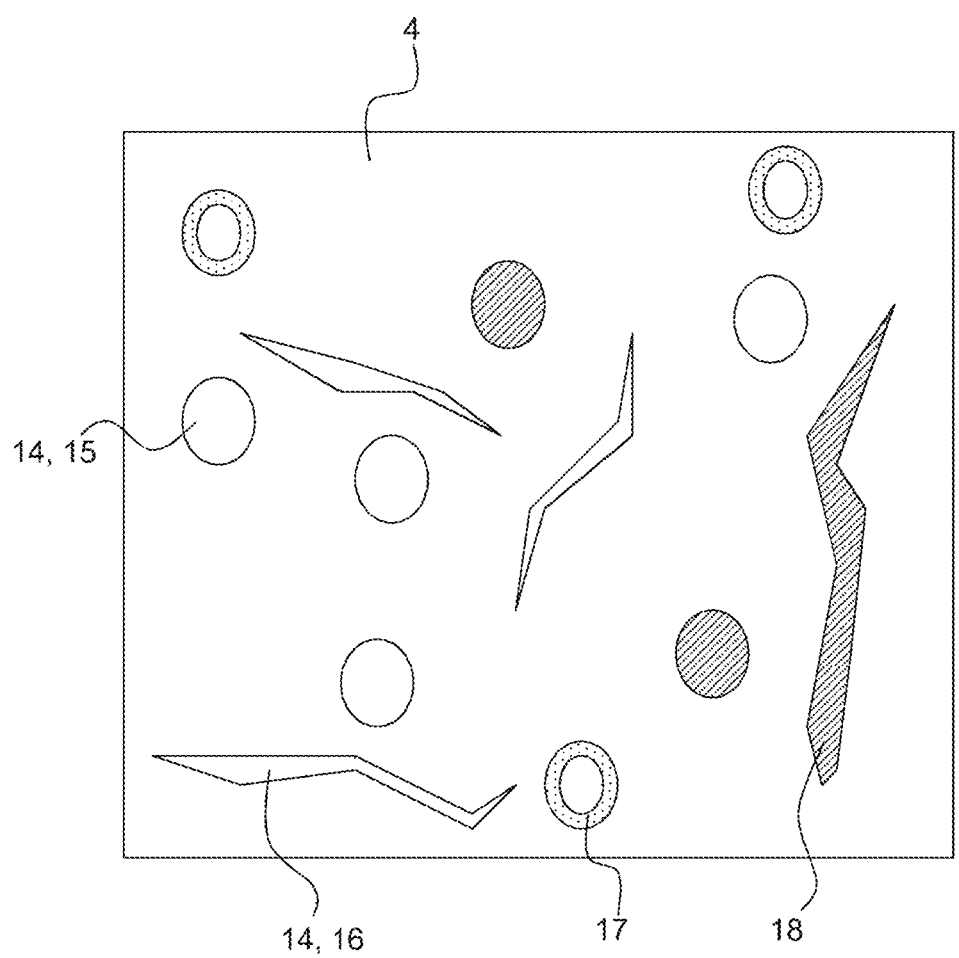
FIG. 4 shows a first exemplary embodiment of a structured piezoelectric layer in a plan view of the xy-plane.

FIG. 4 shows a plan view of the x-y plane for a piezoelectric layer 4 in which the pits form randomly arranged holes 15 and slots 16. The holes 15 and the slots 16 extend in the vertical direction through the piezoelectric layer 4. The piezoelectric layer can be the first piezoelectric layer 4. As described above, the second piezoelectric layer 7 can either remain unstructured or be structured in a similar manner to the first piezoelectric layer 4, but to a lesser extent than the latter.

Some holes 15 are covered with a cladding layer 17 having an anomalous thermomechanical behavior. Said cladding layer 17 counteracts the normal thermomechanical behavior of the piezoelectric layer 4. A partial compensation, a complete compensation or an overcompensation is possible by this means. The sidewalls of the slots 16 could also be covered with the cladding layer 17.

Furthermore, some of the holes 15 and some of the slots 16 are filled with a filling layer 18 composed of a dielectric material having an anomalous thermomechanical behavior. Any material having an anomalous thermomechanical behavior can be used for this purpose.

Furthermore, some of the holes 15 and slots 16 remain free of the cladding layer 17 and the filling layer 18.

FIGS. 5a to 5f show further exemplary embodiments of a structured piezoelectric layer 4. In this case, figures a to f show the piezoelectric layer 4 in a plan view of the x-y plane. Here, too, just like in the subsequent figures, the piezoelectric layer can be the first or the second piezoelectric layer 4, 7.

Figure 5A:
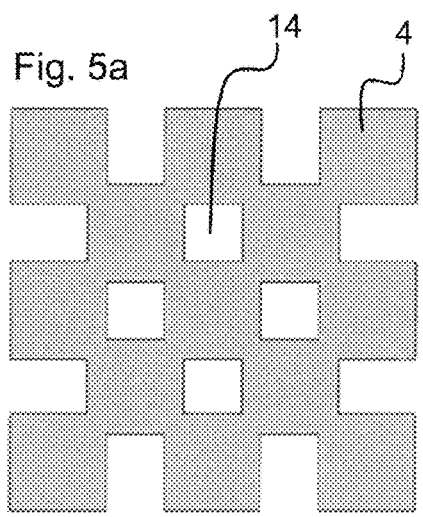
Figure 5D:
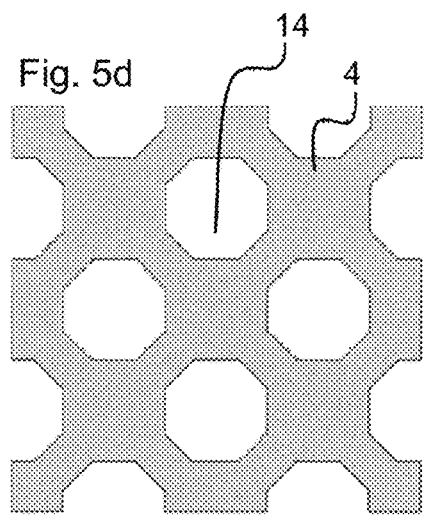
Figure 5B:
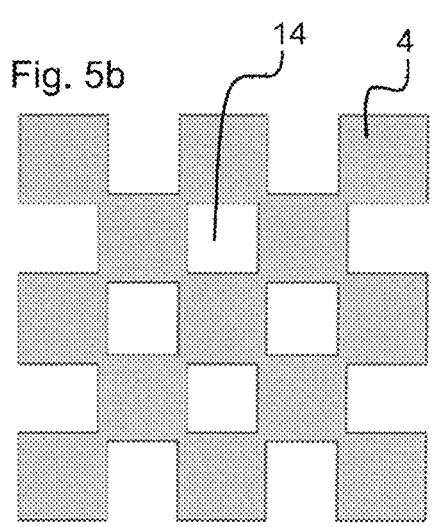
Figure 5E:
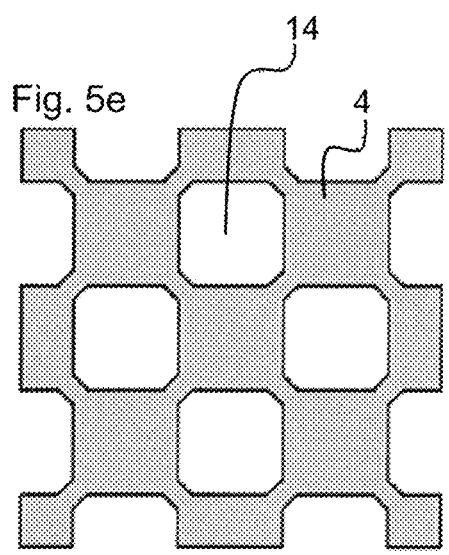
Figure 5C:
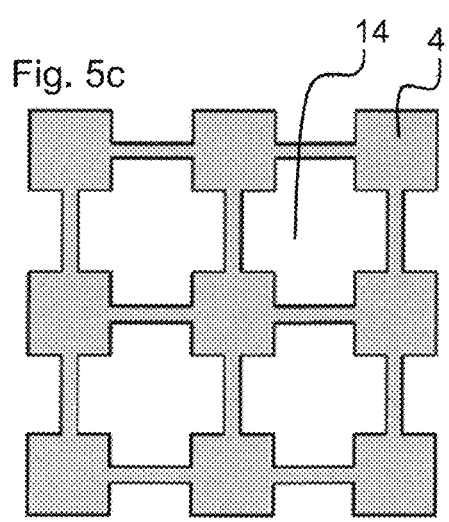
Figure 5F:
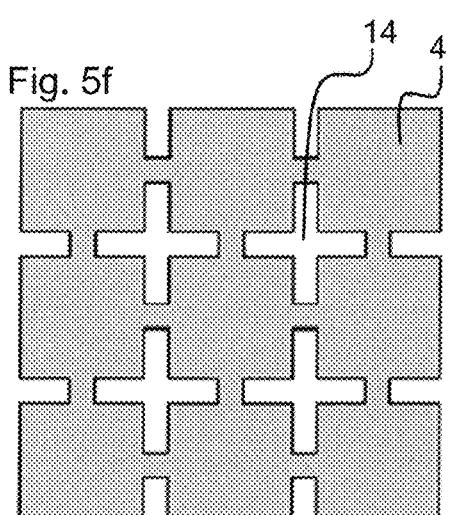

In this case, pits 14 extend in the vertical direction through the piezoelectric layers 4 shown. By means of said pits 14, the respective piezoelectric layer 4 is structured to form blocks. If the pits 14 are configured with a sufficiently small diameter, then the corners of the blocks overlap, as shown in FIG. 5a and FIG. 5b. If the diameter of the pits 14 is chosen to be larger, then the piezoelectric layer 4 is structured to form blocks that are connected to one another by webs, as shown in FIGS. 5c to 5f. In some exemplary embodiments, a web connects two respective blocks at their corners, as shown in FIG. 5d and FIG. 5e. In other exemplary embodiments, the blocks are connected to one another by webs at their side faces, as shown in FIG. 5c and FIG. 5f.

Figure 6:
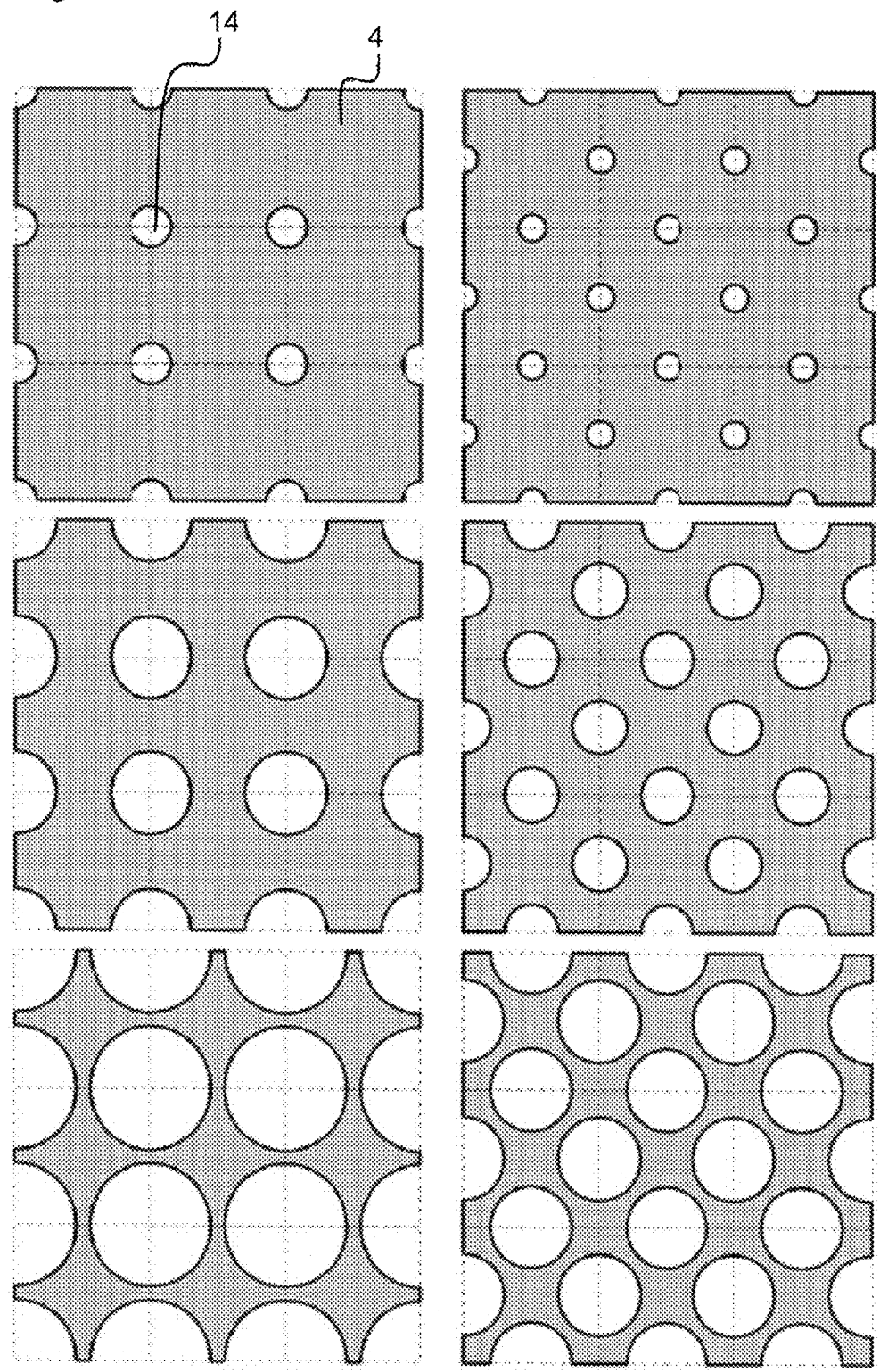

FIG. 6 shows further exemplary embodiments of a structured piezoelectric layer 4, which here, too, is illustrated in a plan view of the x-y plane. The piezoelectric layers 4 shown in FIG. 6 are structured by pits 14 having a circular cross section. In the various illustrations in FIG. 6, the pits 14 have different diameters. The greater the diameter of the pit 14, the greater the extent to which the resonant frequency is reduced and the greater the pole zero distance of the resonator 2 becomes.

The diameters of the pits 14 can be between 0.2 and 6 μm, for example.

Figure 7A:
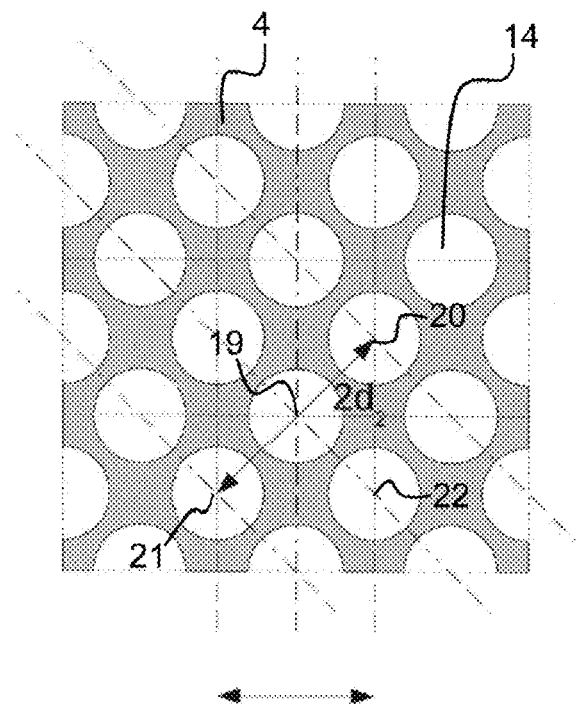
Figure 7B:
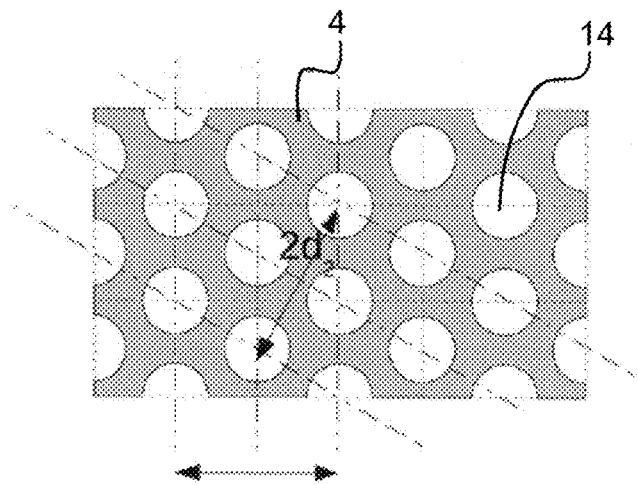

FIG. 7a and FIG. 7b show two further exemplary embodiments of a structured piezoelectric layer 4. The piezoelectric layers 4 are likewise shown in a plan view of the x-y plane in FIGS. 7a and 7b. The piezoelectric layers 4 are in each case structured by pits 14 having a circular cross section. The piezoelectric layers 4 are in each case structured in such a way that a phonic bandgap structure is formed. The phonic bandgap structure ensures, in particular, that emission losses in a lateral direction can be minimized.

In the vertical direction (z-direction), in the case of SMR resonators the acoustic mirror and in the case of FBAR resonators the free boundary condition ensures reflections of the acoustic wave and thus ensures a minimization of losses. If a two-dimensional phonic bandgap structure is furthermore formed, then this minimizes the emission loss in a lateral direction.

The pits 14 are arranged in columns and rows, wherein the columns run in the y-direction. The pits 14 of two adjacent columns are offset relative to one another in this case. The pits are arranged periodically to form columns in such a way that the arrangement of the pits of two columns between which exactly one further column is arranged is identical.

As shown in FIG. 7a, $d_2$ denotes the distance between the mid-points 19, 20 of two pits 14, wherein the first pit 14 is arranged in a first column and the other pit 14 is arranged in the directly adjacent column and is situated closest to the first pit 14. Furthermore, $2d_1$ denotes the distance between the mid-points 21, 22 of two pits 14, wherein the first pit 14 is arranged in a first column and the other pit 14 is situated in the closest column having an identical pit arrangement and in this column is situated closest to the first pit. A phonic bandgap structure is formed if $d_1$ and $d_2$ fulfill the following condition:

$$d_2/d_1=\sqrt{2}$$

A phononic bandgap structure can also be obtained more simply or better by means of other design specifications. One example thereof is illustrated in FIG. 7b. In this case, $2d_1$ and $2d_2$ are defined as shown in FIG. 7b. A phononic bandgap structure results if $d_1$ and $d_2$ fulfill the following condition:

$$d_2/d_1=0.5\times\sqrt{3}$$

In this context this is also referred to as a hexagonal arrangement.

FIG. 8 shows further exemplary embodiments of structured piezoelectric layers 4, wherein the piezoelectric layers 4 are structured in each case to form blocks having hexagonal or dodecagonal basic areas. In some of the exemplary embodiments shown, said blocks merge into one another; in other exemplary embodiments, they are connected to one another via webs.

Figure 9:
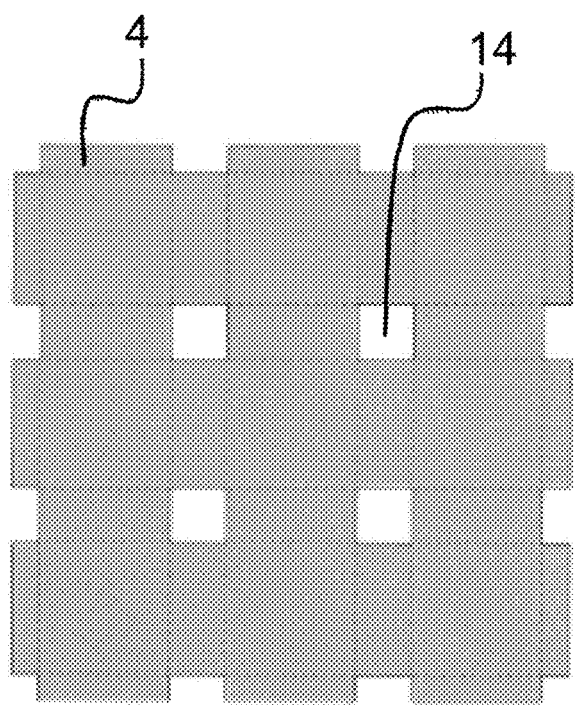

FIG. 9 shows a further exemplary embodiment of a structured piezoelectric layer 4. The piezoelectric layer is structured to form blocks having a square basic area. The side faces of the blocks are connected to one another via webs, wherein the webs have a width corresponding to the side length of the blocks.

LIST OF REFERENCE SIGNS

1 Filter chip
2 First resonator
3 Second resonator
4 First piezoelectric layer
5 Top electrode
6 Bottom electrode
7 Second piezoelectric layer
8 Top electrode
9 Bottom electrode
10 Chip substrate
11 Acoustic mirror
12 First layer of the acoustic mirror
13 Second layer of the acoustic mirror
14 Pit
15 Hole
16 Slot
17 Cladding layer
18 Filling layer
19 Mid-point
20 Mid-point
21 Mid-point
22 Mid-point

The invention claimed is:

1. A filter chip,
   comprising an interconnection of at least one first and one second resonator operating with bulk acoustic waves,
   wherein the first resonator operating with bulk acoustic waves comprises a first piezoelectric layer that is structured in such a way that the first resonator has a lower resonant frequency than the second resonator,
   wherein the first piezoelectric layer forms a phononic bandgap structure.

2. The filter chip as claimed in claim 1,
   wherein the first resonator operating with bulk acoustic waves has a main mode in a thickness direction, and
   wherein the second resonator operating with bulk acoustic waves has a main mode in a thickness direction.

3. The filter chip as claimed in claim 2,
   wherein the first piezoelectric layer is structured with pits that run through the first piezoelectric layer.

4. The filter chip as claimed in claim 2,
   wherein the first piezoelectric layer and/or a second piezoelectric layer of the second resonator are/is structured in such a way that pits extend in a vertical direction through the first and/or the second piezoelectric layer.

5. The filter chip as claimed in claim 4,
   wherein the first piezoelectric layer and the second piezoelectric layer have the same thickness.

6. The filter chip as claimed in claim 2,
   wherein the first and the second resonator are interconnected with one another in a ladder-type structure having at least one series resonator and at least one parallel resonator, wherein the first resonator forms the series resonator or the parallel resonator, and wherein the second resonator forms the respective other selected from series resonator or parallel resonator.

7. The filter chip as claimed in claim 1,
wherein the first and/or the second resonator have/has a trimming layer.

8. The filter chip as claimed in claim 1,
wherein the first resonator and/or the second resonator are/is arranged on an acoustic mirror.

9. The filter chip as claimed in claim 1,
wherein the first resonator and/or the second resonator are/is arranged in a freely oscillating fashion.

10. The filter chip as claimed in claim 1,
wherein the second resonator comprises a second piezoelectric layer, wherein the second piezoelectric layer forms a phononic bandgap structure.

11. The filter chip as claimed in claim 1,
wherein the first and the second resonator are interconnected with one another in a ladder-type structure having at least one series resonator and at least one parallel resonator,
wherein the first resonator forms the series resonator or the parallel resonator, and
wherein the second resonator forms the respective other selected from series resonator or parallel resonator.

12. The filter chip as claimed in claim 1,
which comprises even further resonators, which differ from the first and the second resonator in their resonant frequency.

13. The filter chip as claimed in claim 1,
which is embodied as a duplexer,
wherein at least one first and at least one second resonator are interconnected with one another to form a transmission filter,
wherein the filter chip furthermore comprises at least one third resonator and at least one fourth resonator, which are interconnected with one another to form a reception filter,
wherein the first resonator, the second resonator, the third resonator and the fourth resonator in each case have a mutually different resonant frequency.

14. The filter chip as claimed in claim 1,
wherein the first and the second resonator are an FBAR resonator or an SMR resonator.

15. The filter chip as claimed in claim 1,
wherein the first piezoelectric layer is structured with pits that run through the first piezoelectric layer.

16. The filter chip as claimed in claim 1,
wherein the second piezoelectric layer is unstructured or structured.

17. The filter chip as claimed in claim 1,
wherein the first piezoelectric layer and/or a second piezoelectric layer of the second resonator are/is structured in such a way that pits extend in a vertical direction through the first and/or the second piezoelectric layer.

18. The filter chip as claimed in claim 17,
wherein the first piezoelectric layer and the second piezoelectric layer have the same thickness.

19. A method for producing a filter chip, comprising the following steps:
fabricating a first resonator operating with bulk acoustic waves and having a first piezoelectric layer on a chip substrate,
fabricating a second resonator operating with bulk acoustic waves and having a second piezoelectric layer on the chip substrate,
photolithographically structuring the first piezoelectric layer to form a plurality of pits, and filling one or more of the pits with a filling layer or covering an inner side of the one or more of the pits with a cladding layer.

20. The method for producing a filter chip as claimed in claim 19, which furthermore comprises the following step:
photolithographically structuring the second piezoelectric layer.

21. The method for producing a filter chip as claimed in claim 19,
wherein the plurality of pits form holes and slots.

22. The method for producing a filter chip as claimed in claim 19,
wherein the method comprises filling the one or more of the pits with the filling layer, and
wherein the filling layer comprises a dielectric material having an abnormal thermomechanical behavior.

* * * * *